United States Patent
Ogawa

(10) Patent No.: US 7,774,690 B2
(45) Date of Patent: Aug. 10, 2010

(54) APPARATUS AND METHOD FOR DETECTING DATA ERROR

(75) Inventor: Makoto Ogawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 991 days.

(21) Appl. No.: 11/492,078

(22) Filed: Jul. 25, 2006

(65) Prior Publication Data

US 2007/0033514 A1 Feb. 8, 2007

(30) Foreign Application Priority Data

Jul. 25, 2005 (JP) ............................. 2005-214035

(51) Int. Cl.
*G06F 11/00* (2006.01)
*H03M 13/00* (2006.01)

(52) U.S. Cl. ........................................ 714/801; 714/25
(58) Field of Classification Search ................ 714/801, 714/25
See application file for complete search history.

(56) References Cited

U.S. PATENT DOCUMENTS 3,814,919 A * 6/1974 Repton et al. ................. 714/25

* cited by examiner

*Primary Examiner*—Guy J Lamarre
(74) *Attorney, Agent, or Firm*—Sughrue Mion, PLLC

(57) ABSTRACT

A semiconductor circuit includes a parity bit adding circuit configured to add a parity bit to a data to be read by a CPU; a register configured to hold the data with the parity bit; and a parity check circuit configured to execute a parity check of said data with said parity bit held in said register, and to issue a parity error interrupt when a parity error is detected. A parity bit inverting circuit inverts said parity bit held in said register in response to completion of said parity check.

8 Claims, 6 Drawing Sheets

APPARATUS AND METHOD FOR DETECTING DATA ERROR

BACKGROUND OF THE INVENTION

1. Field of the Invention

The present invention relates to a data error detecting apparatus and a data error detecting method. The present invention particularly relates to a data error detecting apparatus and a data error detecting method in a single-chip microcomputer.

2. Description of the Related Art

Semiconductor devices called as microcomputers are installed in many commercially available apparatuses. The microcomputer has a microprocessor (CPU) for performing arithmetic and logic processing and a memory, which are generally formed as an integrated circuit (IC) on a single LSI chip.

For apparatuses with microcomputers installed, there are apparatuses that reliability is especially important. For example, electric components provided for vehicles require high reliability at all times. For this reason, the microcomputer provided to such an apparatus is designed based on a design concept called fail-safe, in order to measure unexpected trouble occurrence. Such a microcomputer is designed under the presumption that problems such as a failure, an operational mistake, and a design defect occur. In occurrence of the problem, the microcomputer has a function for keeping damage minimum. For example, when a CPU in a system reads out extremely important data, the fail-safe function instantaneously detects data abnormality resulting from device failure by always monitoring the data to prevent occurrence of false operations.

One fail-safe function is realized as a data error detecting apparatus in a microcomputer. A parity bit is added to important data, and a parity check is carried out when a CPU reads the data. If any abnormality is found, parity error interrupt is issued to inform data abnormality as soon as possible.

FIG. 1 is a block diagram showing a configuration of a conventional microcomputer 101 having a data error detecting apparatus. With reference to FIG. 1, the conventional microcomputer 101 includes a peripheral function 102, a data error detecting apparatus 103, and a CPU 104. Additionally, as shown in FIG. 1, the data error detecting apparatus 103 includes a parity bit adding circuit 105, a register 106, and a parity check circuit 107, which are connected through a bus 109.

In the conventional microcomputer 101, the parity bit adding circuit 105 adds a parity bit to a data in storage of the data, and writes the data with the added parity bit into the register 106. The parity check circuit 107 carries out parity check when the CPU 104 reads out the data from the register 106. The parity check circuit 107 determines whether there is any breaking of a data line and failure in a circuit for controlling the data, based on the result of the parity check. When it is determined that there is breaking of the data line or a failure in a circuit for controlling the data, the parity check circuit 107 issues a parity error interrupt, thereby detecting data abnormality.

As stated above, the conventional data error detecting apparatus 103 detects a failure in the microcomputer 101 by carrying out parity check to detect a data error corresponding to the data line (data line and the circuit for controlling the data). In general, the data error detecting apparatus 103 does not monitor any failure in the control circuit for writing the data into the register, breaking of a clock line, and so on. Therefore, the data error detecting apparatus 103 cannot know whether or not the data is originally right. In other words, the data error detecting apparatus 103 regards a currently retained data as a correct data and continues a reading operation even when data update is no longer possible.

FIG. 2 shows an operation of the data error detecting apparatus 103 in the conventional microcomputer 101 when there is occurrence of a failure in a control circuit writing data into a register or breaking of a clock line. With reference to FIG. 2, the following data are outputted from the peripheral function 102:

First time: 0111;
Second time: 0101;
Third time: 1110; and
Fourth time: 1010.

Also, it is shown that data update is not carried out due to the breaking of a line when the data should be updated from second data to third data. As shown in FIG. 2, the parity check circuit 107 reads non-update data when data update is not possible due to the breaking of the line. At this time, an error is not detected in the parity check since a consistency between a register value and a parity bit is kept. For this reason, the CPU reads an old data as a correct data, leading a delay to detection of trouble occurrence. Therefore, the conventional data error detecting apparatus 103 continues data readout without determination of a failure even if a read value is the same value for ten consecutive times.

SUMMARY OF THE INVENTION

In an aspect of the present invention, a semiconductor circuit includes a parity bit adding circuit configured to add a parity bit to a data to be read by a CPU; a register configured to hold the data with the parity bit; and a parity check circuit configured to execute a parity check of said data with said parity bit held in said register, and to issue a parity error interrupt when a parity error is detected. A parity bit inverting circuit inverts said parity bit held in said register in response to completion of said parity check.

Here, the parity check circuit supplies an interrupt signal to the CPU in response to an execution result of the parity check.

Also, in another aspect of the present invention, a microcomputer includes a CPU; a peripheral circuit configured to output a data to be read out by the CPU; a parity bit adding circuit configured to ads a parity bit to the data and generates the data with the parity bit; and a register configured to hold the data with the parity bit. A parity check circuit executes a parity check of the data with the parity bit held by the register, and issues a parity error interrupt when a parity error is detected. A parity bit inverting circuit inverts said parity bit held in said register in response to completion of said parity check.

Here, the parity check circuit supplies an interrupt signal to the CPU in response to execution result of the parity check.

Also, the microcomputer may further include a memory; and a direct memory access controller configured to execute a direct memory access in response to an instruction from the peripheral circuit.

Also, still another aspect of the present invention, an error detecting method is achieved by adding a parity bit to a data to be read out by a CPU; by writing the data with the parity bit in a register; by carrying out a parity check of the data with the parity bit; and by inverting said parity bit added to said data in response to an execution completion by the parity check.

Here, the error detecting method may be achieved by further supplying an interrupt signal to the CPU in response to execution result of the parity check.

DESCRIPTION OF THE PREFERRED EMBODIMENTS

Hereinafter, a microcomputer having a data error detecting apparatus of the present invention will be described in detail with reference to the attached drawings.

First Embodiment

Figure 1:
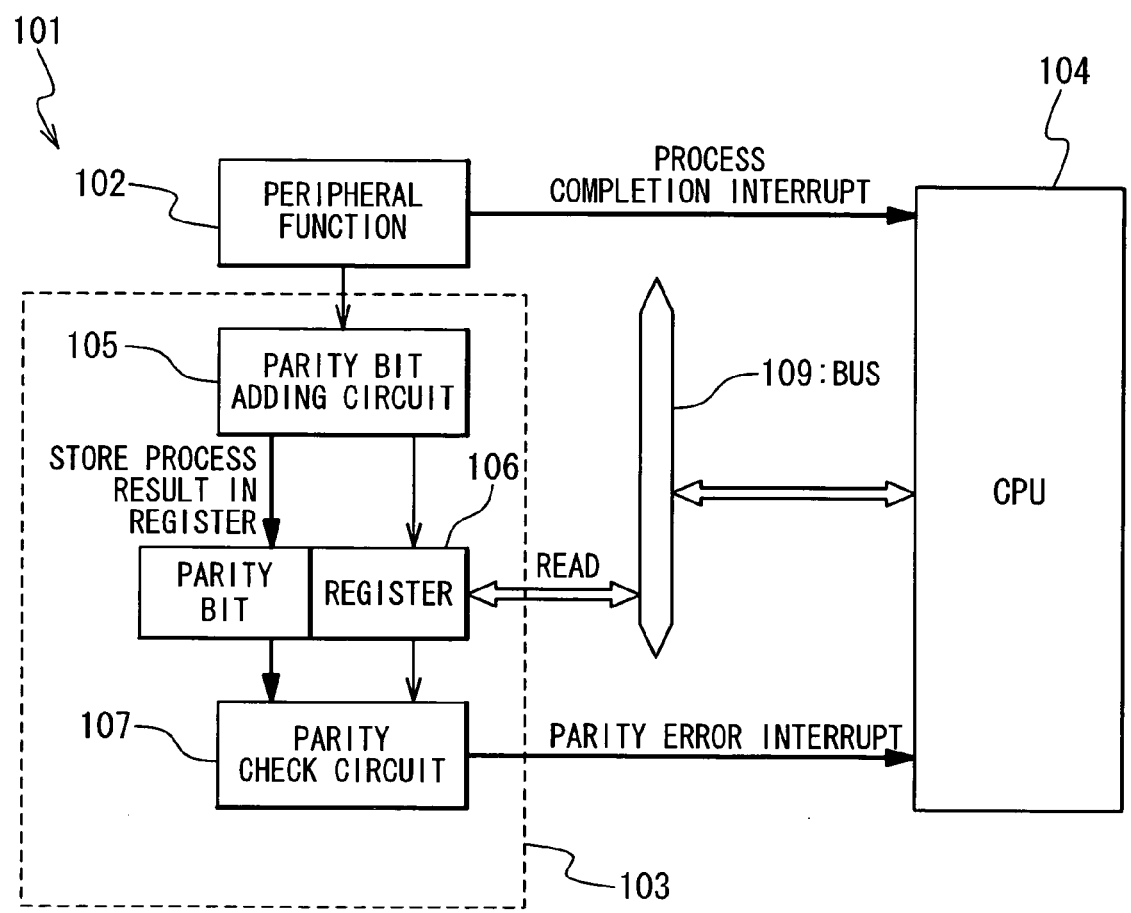
FIG. 1 is a block diagram showing a configuration of a conventional data error detecting apparatus.
Figure 2:
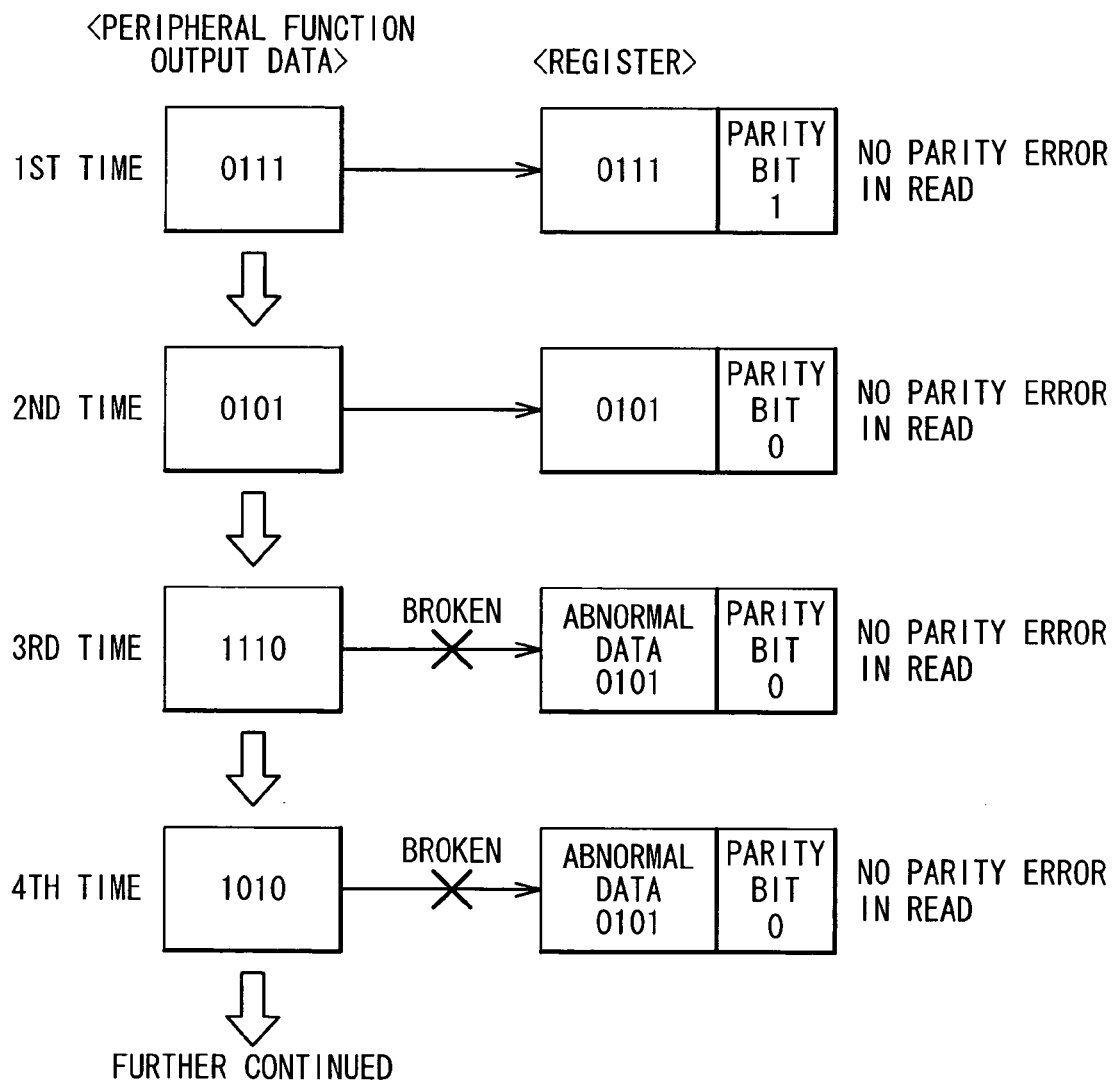
FIG. 2 is a diagram showing an operation when a trouble has occurred in the conventional data error detecting apparatus.
Figure 3:
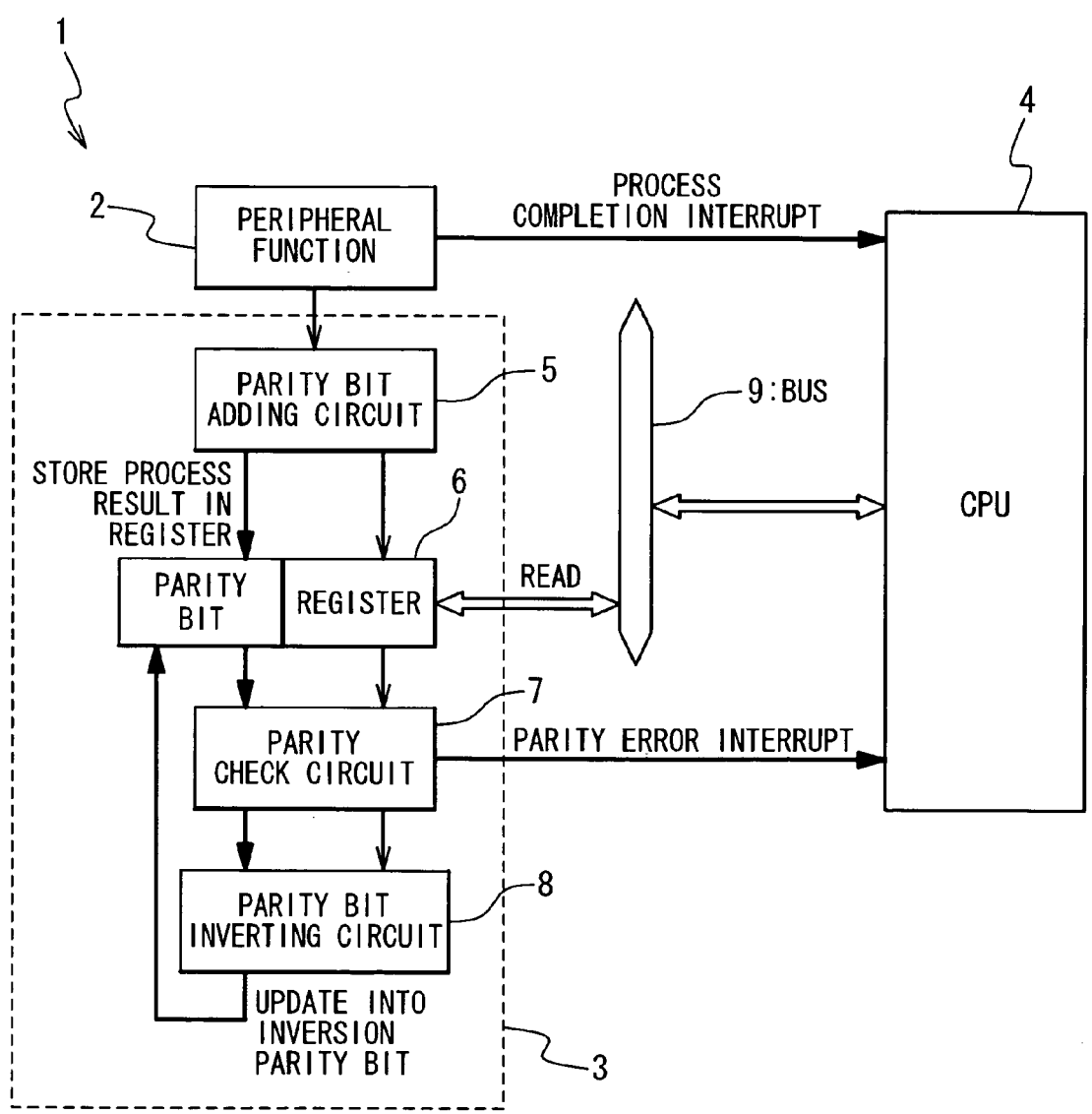
FIG. 3 is a block diagram showing a configuration of a microcomputer having a data error detecting apparatus according to a first embodiment of the present invention.

FIG. 3 is a block diagram showing the configuration of a microcomputer with the data error detecting apparatus according to the first embodiment of the present invention. In the first embodiment, it is assumed that the microcomputer is a single-chip microcomputer. However, it does not mean that the present invention is applicable only to the single-chip microcomputer. With reference to FIG. 3, a microcomputer 1 in the first embodiment includes a peripheral function 2, a data error detecting apparatus 3, and a CPU 4, which are connected through a bus 9.

The peripheral function 2 is a circuit block having functions of circuits such as an A/D converter, a communication unit, a timer, and so on, all of which can be controlled by the CPU in the microcomputer. In the first embodiment, all those functions are together referred to as the peripheral function 2. However, it does not mean that the peripheral function 2 of the present invention is limited to the above-mentioned functions. The data error detecting apparatus 3 is an error detecting function block for monitoring that an error has occurred in data read out by the CPU 4, and detecting a trouble of the microcomputer 1 based on the data error. A detailed structure of the data error detecting apparatus 3 will be described later. The CPU 4 is an arithmetic and logical processing device for performing control of each unit provided for the microcomputer 1 and data processing.

As shown in FIG. 3, the data error detecting apparatus 3 includes a parity bit adding circuit 5, a register 6, a parity check circuit 7, and a parity bit inverting circuit 8. The parity bit adding circuit 5 calculates a parity bit (of "0" or "1") to be added to a data based on that data outputted from the peripheral function 2. The register 6 is a memory circuit for holding the data outputted from the parity bit adding circuit 5 and the parity bit corresponding to the data. The parity check circuit 7 carries out parity check in response to readout of the data from the register 6. The parity bit inverting circuit 8 updates the data held in the register 6 in response to completion of the parity check carried out by the parity check circuit 7.

Figure 4:
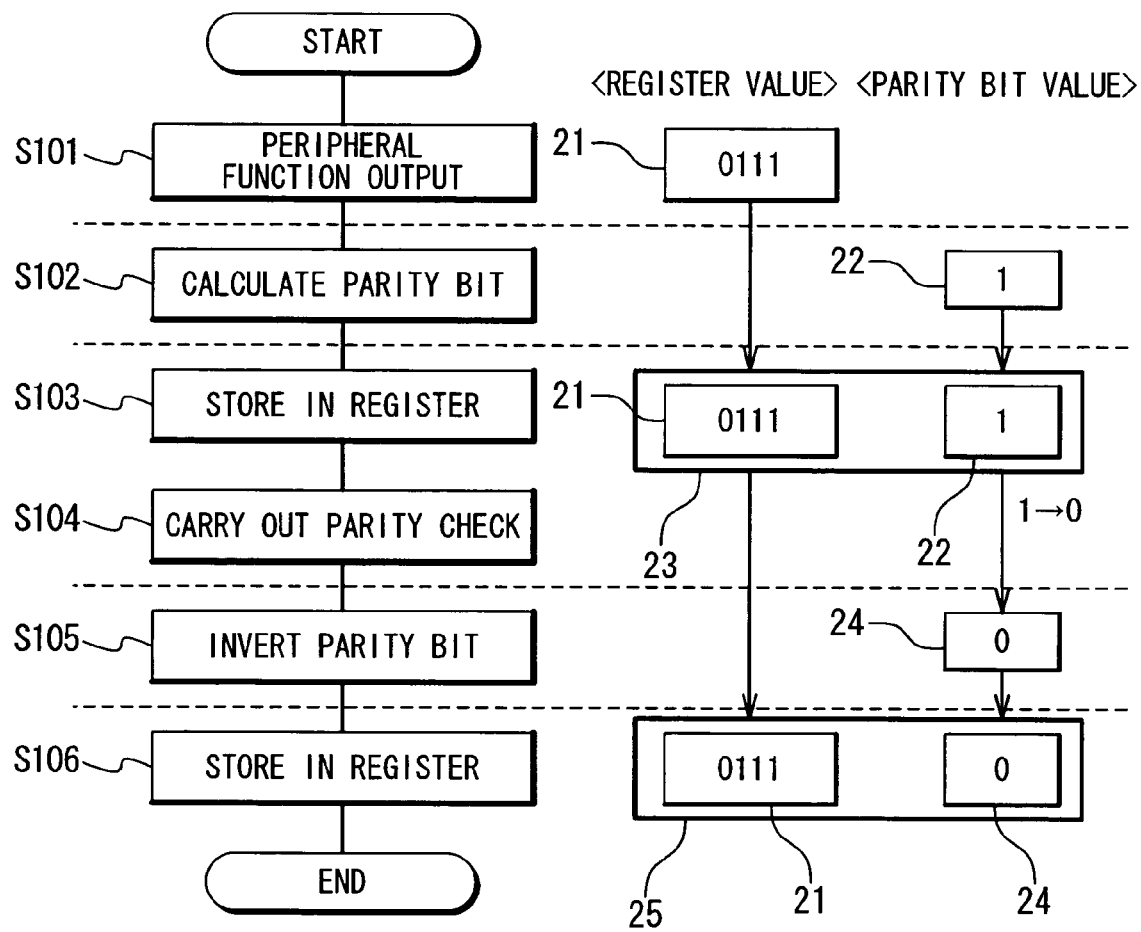
FIGS. 4A and 4B are diagrams showing an operation of the microcomputer having the data error detecting apparatus in the first embodiment.

Next, an operation of the microcomputer 1 will be described with reference to the attached drawings. FIG. 4 is a diagram showing an operation from output of a single data from the peripheral function 2 to output of a next data. With reference to FIG. 4, at step S101, the peripheral function 2 outputs a data 21 used for the operation of the microcomputer. The data 21 outputted by the peripheral function 2 is supplied to the parity bit adding circuit 5 of the data error detecting apparatus 3.

At step S102, the parity bit adding circuit 5 calculates the number of bits of the data 21 supplied from the peripheral function 2, and determines a parity bit value 22 to be added to the data based on the calculated result.

At step S103, the register 6 stores the data with the parity bit 23 supplied from the parity bit adding circuit 5.

At step S104, the parity check circuit 7 carries out the parity check for the data with the parity bit 23 stored in the register 6 in response to the data read out from the register 6 by the CPU 4.

At step S105, the parity check circuit 7 notifies the parity bit inverting circuit 8 of the completion of the parity check. In response to the notification, the parity bit inverting circuit 8 extracts the parity bit 22 of the data currently stored in the register 6. The parity bit inverting circuit 8 inverts the extracted parity bit 22 to generate an inverted parity bit 24, and updates the parity bit 22 in the register 6 to the inverted parity bit 24.

Consequently, the register 6 holds a data 21 with the inverted parity bit 24 as the held data 25 until a new data 21 is outputted.

Figure 5:
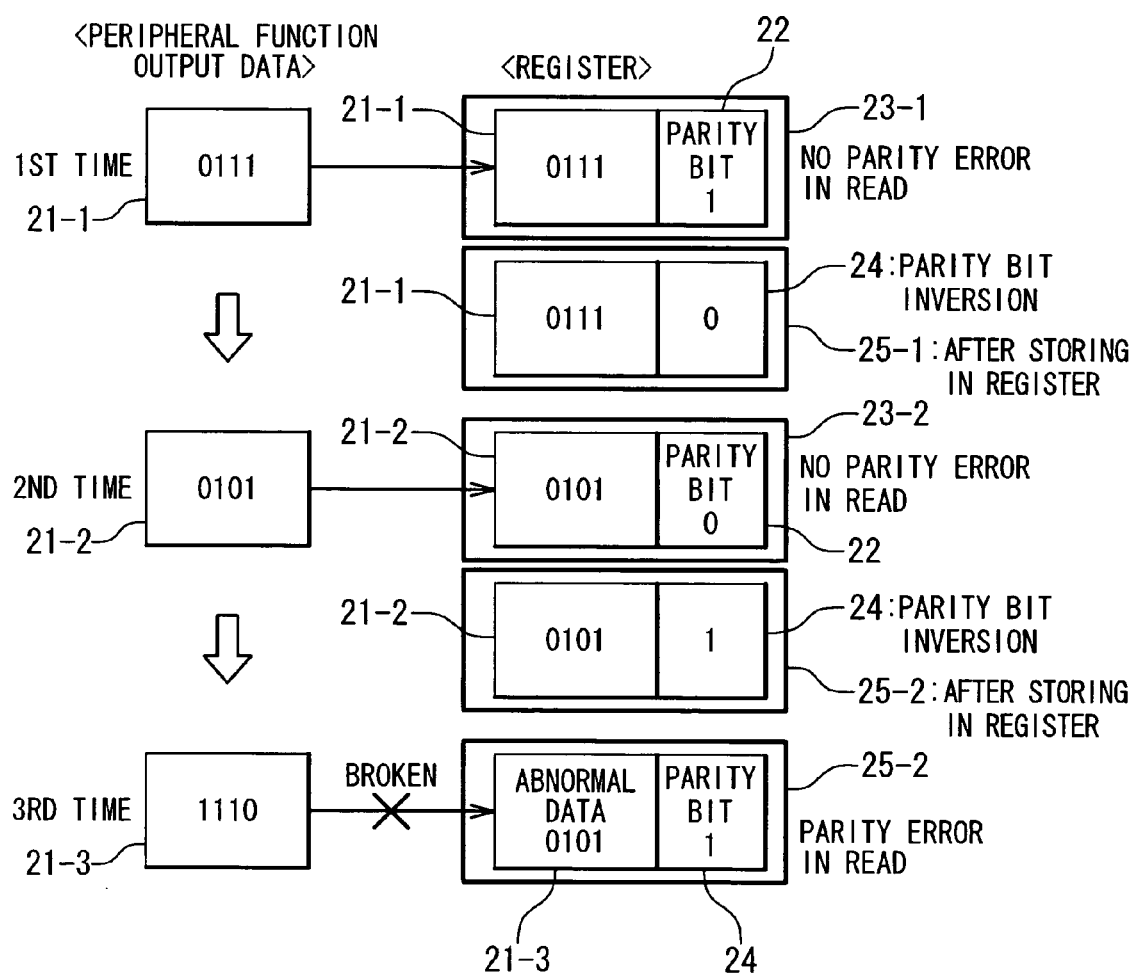
FIG. 5 is a diagram showing an error detecting operation of the data error detecting apparatus in the first embodiment.

An error detecting operation when data update is not carried out will be described below with reference to the attached drawings. FIG. 5 is a diagram showing the error detecting operation in case of the data error detecting apparatus in the first embodiment. With reference to FIG. 5, a 4-bit data is outputted by the peripheral function 2 at given timing, a parity bit is added to the 4-bit data, and is stored in the register 6. In the first embodiment, an example that the following three data are outputted at first to third timings as shown in FIG. 5:

First data 21-1: 0111;
Second data 21-2: 0101; and
Third data 21-3: 1110

With reference to FIG. 5, the parity bit value 22 is calculated based on the first data 21-1 at the first timing. As mentioned above, the parity bit adding circuit 5 stores the first data with the parity bit 23-1 attached with "1" as the parity bit 22 ("0111" and "1") in the register 6. In response to the parity check carried out by the parity check circuit 7, the parity bit inverting circuit 8 inverts the parity bit value 22 ("1") to the inverted parity bit 24 ("0"), and updates the data in the register 6. At the first timing, therefore, the register 6 holds the first data with the inverted parity bit 25-1 which includes the inverted parity bit 24 ("0111" and "0") after the parity check is carried out.

The second data 21-2 is outputted at the second timing, and the parity bit adding circuit 5 calculates the parity bit 22 based on the second data 21-2. As stated above, the parity bit adding circuit 5 stores as a total data 23-2, the second data 21-2 with the parity bit 22 of "0" in the register 6. The CPU 4 reads out the second data with the parity bit 23-2 from the register 6 in synchronization with the second timing. The parity check circuit 7 carries out the parity check in response to the readout operation of the CPU 4. With reference to FIG. 5, since the microcomputer 1 at this time operates normally, the data error detecting apparatus 3 proceeds the processing without detecting errors. The parity bit inverting circuit 8 writes the second data with the inverted parity bit 25-2 into the register 6 in response to the completion of the parity check.

At the third timing, the third data 21-3 is outputted. At this time, the operation of writing the third data 21-3 into the register 6 is not carried out due to a factor (e.g., breaking of a control line). In that case, the CPU 4 reads out the second data with the inverted parity bit 25-2 from the register 6 in synchronization with the third timing. In response to the readout of the second data with the inverted parity bit 25-2 from the register 6 by the CPU 4, the parity check circuit 7 carries out the parity check for the second data with the inverted parity bit 25-2. As shown in FIG. 5, the second data with the inverted parity bit 25-2 is generated by inverting the parity bit of the second data with the parity bit 23-2 read out at the second timing. Therefore, the parity check circuit 7 detects the parity error, and issues a parity error interrupt signal to the CPU 4 in response to the error detection.

With the above configuration and operation, a data held in the register 6 is regarded as an old data, and a parity bit is inverted in order to indicate that the register value is old, after the readout operation of the CPU 4 is carried out. Therefore, the error is detected in the parity check if the old data has not been updated due to some reason. At this time, the parity check circuit 7 generates an interrupt to the CPU 4. Then, it is possible for the microcomputer 1 to properly shift to error routines.

Second Embodiment

Figure 6:
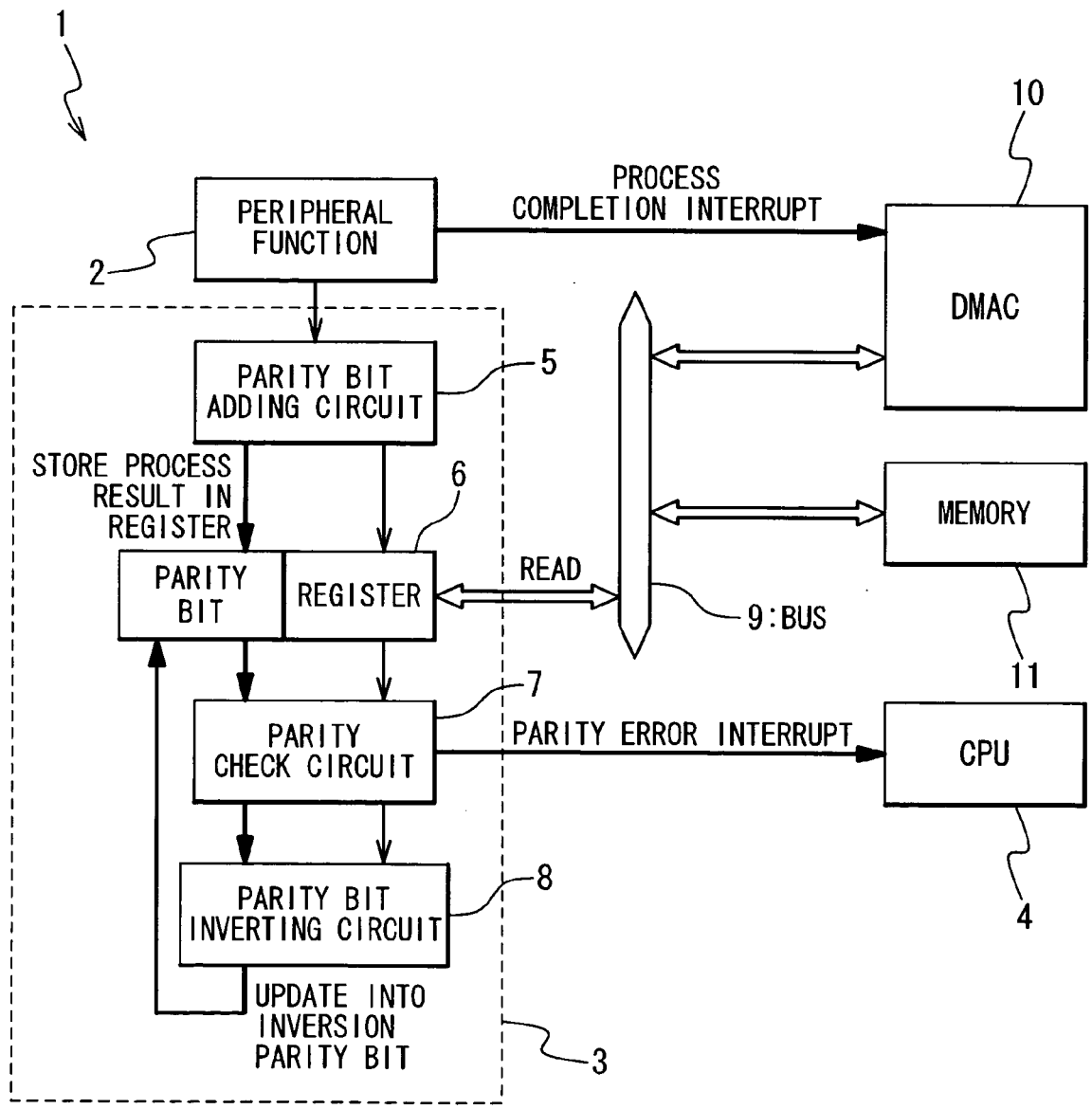
FIG. 6 is a block diagram showing a configuration of the microcomputer with the data error detecting apparatus according to a second embodiment of the present invention.

Next, the microcomputer with the data error detecting apparatus according to the second embodiment of the present invention will be described in detail with reference to the attached drawings. FIG. 6 is a block diagram showing the configuration of the microcomputer in the second embodiment. In the block diagram of FIG. 6, some circuit blocks are allocated with the same reference numerals as those of circuit blocks in the first embodiment. This means that such a circuit block has the same configuration and operation in the first and second embodiments. For this reason, detailed description on the circuit block will be omitted in the second embodiment.

With reference to FIG. 6, a microcomputer 1 in the second embodiment further includes a DMAC (Direct Memory Access Controller) 10 and a memory 11 in addition to the configuration of the microcomputer 1 mentioned in the first embodiment. The DMAC 10 is a control circuit which carries out control for sending and receiving data directly (not through a CPU) between the memory 11 and a peripheral unit (e.g., the register 6 in the second embodiment). The memory 11 is a main memory used in running a program, being provided to the microcomputer 1.

Next, an operation in the second embodiment will be described. Receiving a processing completion interrupt from the peripheral function 2, the DMAC 10 carries out data transfer by the DMA. Therefore, the DMAC 10 carries out data transfer from the register 6 to the memory 11. At this time, the parity check circuit 7 carries out the parity check for the data 21 held in the register 6 in response to the readout of the data 21 from the register 6. After the completion of the parity check, the parity check circuit 7 notifies the parity bit inverting circuit 8 of the parity check completion. In response to the notification, the parity bit inverting circuit 8 as in the first embodiment, extracts the parity bit 22 of the data with the parity bit 23 currently held in the register 6, and stores the data with the inverted parity bit 25 in the register 6. As in the first embodiment, therefore, it is possible to detect the error in the parity check even when a trouble occur in parts other than data line and data update is not properly carried out. When detecting the error, the parity check circuit 7 generates an interrupt signal and supplies the interrupt signal to the CPU 4. Then, an immediate shift to error routines is possible.

As described above, the trouble on a data line (one-bit failure) is detected by the ordinary parity check while failures in a control line where register update is impossible, is detected by the data error detecting apparatus in the embodiment. As a result, it is possible to provide a microcomputer with improved reliability compared with conventional microcomputers. Also, the error detection according to the present invention is achievable with addition of only a small number of circuits. Additionally, it is possible to combine the above-mentioned embodiments under the condition that no contradiction is found between the configurations and operations in the embodiments.

In this way, the present invention makes it possible to provide a microcomputer that can distinguish abnormal data from correct data even with the same value data, by providing means to distinguish between new data and old data.

What is claimed is:

1. A semiconductor circuit comprising:
   a parity bit adding circuit configured to add a parity bit to a data to be read by a CPU;
   a register configured to hold said data with said parity bit;
   a parity check circuit configured to execute a parity check of said data with said parity bit held in said register, and to issue a parity error interrupt when a parity error is detected; and
   a parity bit inverting circuit configured to invert said parity bit held in said register in response to completion of said parity check at least when the parity error is not detected.

2. The semiconductor circuit according to claim 1, wherein said parity check circuit supplies an interrupt signal to the CPU in response to an execution result of said parity check.

3. A microcomputer comprising:
   a CPU;
   a peripheral circuit configured to output a data to be read by said CPU;
   a parity bit adding circuit configured to add a parity bit to said data and generates the data with the parity bit;
   a register configured to hold the data with the parity bit;
   a parity check circuit configured to execute a parity check of the data with the parity bit held by said register; and
   a parity bit inverting circuit configured to invert said parity bit held in said register in response to completion of said parity check at least when the parity error is not detected.

4. The microcomputer according to claim 3, wherein said parity check circuit supplies said CPU with an interrupt signal in response to execution result of the parity check.

5. The microcomputer according to claim 4, further comprising:
   a memory;
   a direct memory access controller configured to execute a direct memory access in response to an instruction from said peripheral circuit.

6. An error detecting method comprising:
   adding a parity bit to a data to be read by a CPU;
   writing said data with said parity bit in a register;
   carrying out a parity check of said data with said parity bit; and
   inverting said parity bit added to said data in response to an execution completion by said parity check at least when the parity error is not detected.

7. The error detecting method according to claim 6, further comprising:
   supplying an interrupt signal to said CPU in response to execution result of said parity check.

8. A microcomputer comprising:
a CPU;
a memory;
a peripheral circuit being configured to output a data;
a direct memory access controller configured to control a direct memory access to said memory in response to an instruction from said peripheral circuit;
a parity bit adding circuit configured to add a parity bit to said data and generates the data with the parity bit;
a register configured to hold the data with the parity bit;
a parity check circuit configured to execute a parity check of the data with the parity bit held by said register; and
a parity bit inverting circuit configured to invert said parity bit held in said register in response to completion of said parity check at least when the parity error is not detected.

* * * * *